United States Patent
Kim et al.

(10) Patent No.: US 10,388,563 B2
(45) Date of Patent: Aug. 20, 2019

(54) SEMICONDUCTOR DEVICE

(71) Applicant: SAMSUNG ELECTRONICS CO., LTD., Suwon-si, Gyeonggi-do (KR)

(72) Inventors: Rak Hwan Kim, Suwon-si (KR); Byung Hee Kim, Seoul (KR); Sang Bom Kang, Seoul (KR); Jong Jin Lee, Seoul (KR); Eun Ji Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 34 days.

(21) Appl. No.: 15/668,029

(22) Filed: Aug. 3, 2017

(65) Prior Publication Data

US 2018/0166334 A1    Jun. 14, 2018

(30) Foreign Application Priority Data

Dec. 14, 2016  (KR) .......................... 10-2016-0170446

(51) Int. Cl.
*H01L 23/532* (2006.01)
*H01L 21/768* (2006.01)
*H01L 23/485* (2006.01)

(52) U.S. Cl.
CPC ...... *H01L 21/76846* (2013.01); *H01L 21/768* (2013.01); *H01L 21/76805* (2013.01); *H01L 21/76877* (2013.01); *H01L 23/485* (2013.01); *H01L 23/532* (2013.01); *H01L 23/5329* (2013.01); *H01L 23/53209* (2013.01); *H01L 23/53295* (2013.01); *H01L 21/76871* (2013.01)

(58) Field of Classification Search
CPC ......... H01L 21/76846; H01L 21/76805; H01L 21/76877; H01L 23/485; H01L 23/53209; H01L 23/5329; H01L 23/53295
USPC ....................................................... 257/635
See application file for complete search history.

(56) References Cited

U.S. PATENT DOCUMENTS

| | | | | |
|---|---|---|---|---|
| 5,430,258 A | * | 7/1995 | Hoshino | H01L 21/76834 174/250 |
| 5,592,024 A | * | 1/1997 | Aoyama | H01L 21/76801 257/751 |
| 5,714,804 A | * | 2/1998 | Miller | H01L 21/76843 257/734 |
| 5,814,560 A | * | 9/1998 | Cheung | H01L 21/76886 257/E21.591 |
| 5,874,360 A | * | 2/1999 | Wyborn | H01L 21/28556 257/E21.17 |
| 5,913,147 A | * | 6/1999 | Dubin | H01L 21/288 257/E21.174 |

(Continued)

*Primary Examiner* — Ori Nadav
(74) *Attorney, Agent, or Firm* — Lee & Morse, P.C.

(57) ABSTRACT

A semiconductor device includes a lower layer, an upper layer on the lower layer, a contact between the lower layer and the upper layer, the contact electrically connects the lower layer and the upper layer, a capping pattern wrapping around the contact and covering an upper surface of the contact, a barrier layer wrapping around the capping pattern and covering a lower surface of the capping pattern and a lower surface of the contact, and an interlayer insulating layer between the lower layer and the upper layer, the interlayer insulating layer wrapping around the barrier layer and exposing an upper surface of the capping pattern, wherein the capping pattern includes a material having an etching selectivity with respect to an oxide.

19 Claims, 9 Drawing Sheets

(56) References Cited

U.S. PATENT DOCUMENTS

| | | | | |
|---|---|---|---|---|
| 6,077,774 A * | 6/2000 | Hong | | H01L 21/76828 |
| | | | | 257/751 |
| 6,100,184 A * | 8/2000 | Zhao | | H01L 21/7681 |
| | | | | 257/E21.579 |
| 6,107,687 A * | 8/2000 | Fukada | | H01L 21/76849 |
| | | | | 257/751 |
| 6,171,960 B1 * | 1/2001 | Lee | | H01L 21/76834 |
| | | | | 257/E21.576 |
| 6,355,983 B2 * | 3/2002 | Graas | | H01L 21/76885 |
| | | | | 257/751 |
| 6,417,561 B1 * | 7/2002 | Tuttle | | B82Y 10/00 |
| | | | | 257/295 |
| 6,429,522 B2 * | 8/2002 | Petrarca | | H01L 21/764 |
| | | | | 257/506 |
| 6,680,106 B1 * | 1/2004 | Thangaraj | | G11B 5/722 |
| | | | | 428/336 |
| 6,734,559 B1 * | 5/2004 | Yang | | H01L 21/76843 |
| | | | | 257/750 |
| 6,836,017 B2 * | 12/2004 | Ngo | | H01L 21/76831 |
| | | | | 257/751 |
| 7,157,795 B1 * | 1/2007 | Erb | | H01L 21/2855 |
| | | | | 257/751 |
| 7,190,079 B2 * | 3/2007 | Andricacos | | H01L 21/2885 |
| | | | | 257/758 |
| 7,332,813 B2 * | 2/2008 | Ueno | | H01L 21/288 |
| | | | | 257/751 |
| 7,851,357 B2 | 12/2010 | Cabral, Jr. et al. | | |
| 8,592,303 B2 * | 11/2013 | Tada | | H01L 21/76802 |
| | | | | 438/597 |
| 8,786,087 B2 * | 7/2014 | Harada | | H01L 21/76807 |
| | | | | 257/751 |
| 9,209,073 B2 | 12/2015 | Yang et al. | | |
| 9,287,213 B2 | 3/2016 | Zhang et al. | | |
| 9,330,939 B2 | 5/2016 | Zope et al. | | |
| 9,859,218 B1 * | 1/2018 | Patlolla | | H01L 23/53238 |
| 9,859,219 B1 * | 1/2018 | Adusumilli | | H01L 23/53238 |
| 9,905,513 B1 * | 2/2018 | Briggs | | H01L 23/528 |
| 2002/0177287 A1 * | 11/2002 | Downey | | H01L 23/5223 |
| | | | | 438/396 |
| 2009/0289370 A1 | 11/2009 | Besser et al. | | |
| 2014/0183738 A1 | 7/2014 | Jezewski et al. | | |
| 2015/0221695 A1 | 8/2015 | Park et al. | | |
| 2015/0318243 A1 | 11/2015 | Lin et al. | | |
| 2016/0163586 A1 | 6/2016 | Siew et al. | | |
| 2016/0190068 A1 | 6/2016 | Lee et al. | | |

* cited by examiner

SEMICONDUCTOR DEVICE

Korean Patent Application No. 10-2016-0170446, filed on Dec. 14, 2016, in the Korean Intellectual Property Office, and entitled: "Semiconductor Device," is incorporated by reference herein in its entirety.

BACKGROUND

1. Field

The present disclosure relates to a semiconductor device.

2. Description of the Related Art

Recently, semiconductor devices have been miniaturized and have been improved in performance. As a result, a dimension of a contact included in the semiconductor device has also decreased.

SUMMARY

According to some embodiments, there is provided a semiconductor device including a lower layer, an upper layer disposed on the lower layer, a contact disposed between the lower layer and the upper layer to electrically connect the lower layer and the upper layer, a capping pattern which wraps around the contact and covers an upper surface of the contact, a barrier layer which warps around the capping pattern, and covers a lower surface of the capping pattern and a lower surface of the contact and an interlayer insulating layer which is disposed between the lower layer and the upper layer, the interlayer insulating layer is disposed to wrap around the barrier layer, and exposes an upper surface of the capping pattern, wherein the capping pattern includes a substance having etching selectivity with respect to an oxide.

According to some embodiments, there is also provided a semiconductor device including a lower layer including a first region, an interlayer insulating layer disposed on the lower layer, a contact trench disposed in the interlayer insulating layer and penetrates the interlayer insulating layer to expose at least a part of the first region, a barrier layer which includes a first part disposed along both sidewalls of the contact trench, and a second part disposed along a bottom surface of the contact trench, a contact which fills a part of the contact trench and is disposed to be spaced apart from the first part of the barrier layer, a liner disposed inside the contact trench between the contact and the first part of the barrier layer and a capping layer which is disposed on the contact and the liner and is disposed to fill a remaining part of the contact trench, wherein the capping layer and the liner includes one of ruthenium and tungsten.

According to some embodiments, there is also provided a semiconductor device including a lower layer, an interlayer insulating layer on the lower layer, a contact through the interlayer insulating layer and electrically connected to the lower layer, and a capping pattern directly on sidewalls and on an upper surface of the contact, the capping pattern being between the interlayer insulating layer and sidewalls of the contact, and the capping pattern including a material having an etching selectivity with respect to an oxide.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Unless defined otherwise, all technical and scientific terms used herein have the same meaning as commonly understood by one of ordinary skill in the art. It is noted that the use of any and all examples, or exemplary terms provided herein is intended merely to better illuminate embodiments and is not a limitation of the scope of the embodiments unless otherwise specified. Further, unless defined otherwise, all terms defined in generally used dictionaries may not be overly interpreted.

Hereinafter, a semiconductor device according to some embodiments will be described with reference to FIGS. 1 to 5.

Figure 1:
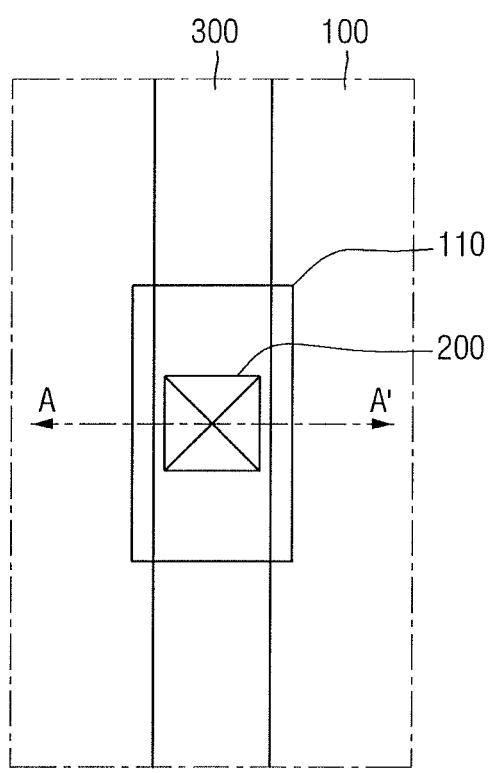
FIG. 1 illustrates a layout diagram of a semiconductor device according to some embodiments.
Figure 2:
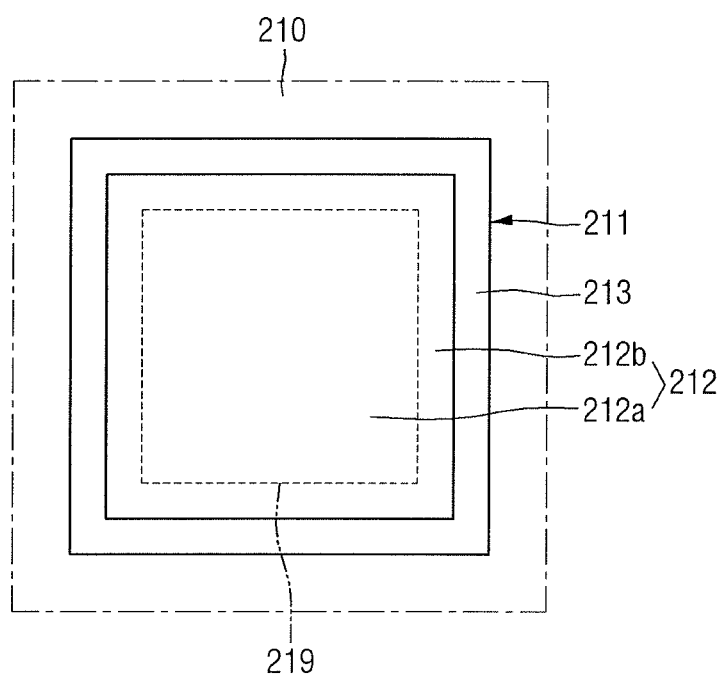
FIG. 2 illustrates a plan view of a contact structure of FIG. 1.
Figure 3:
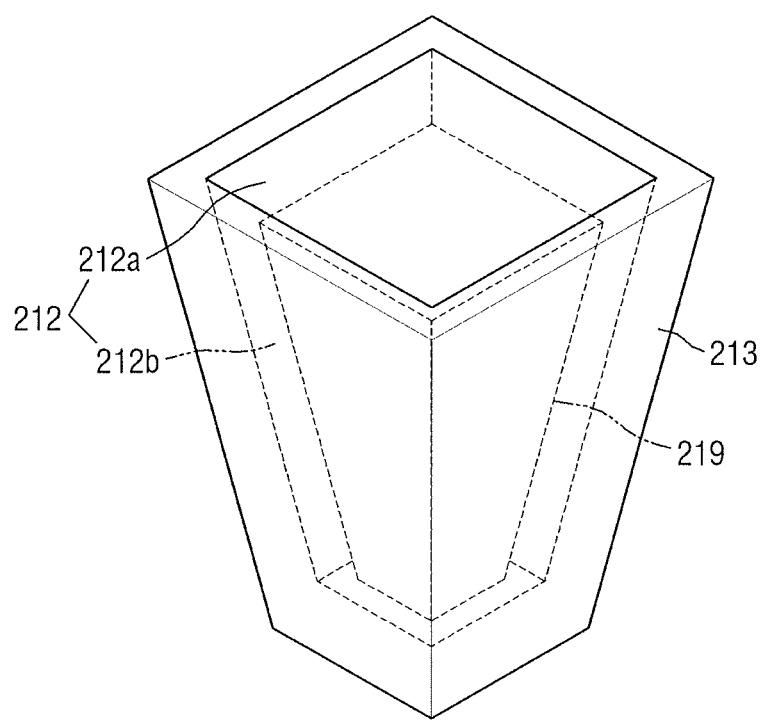
FIG. 3 illustrates a perspective view of the contact structure of FIG. 1.
Figure 4:
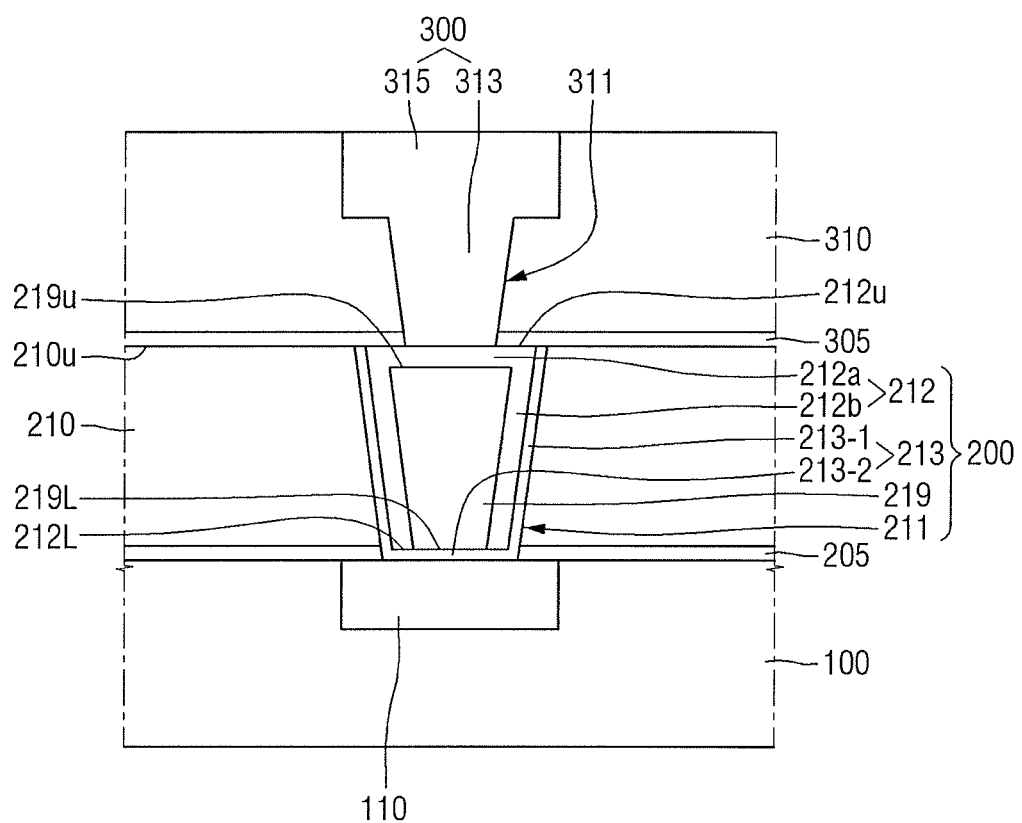
FIGS. 4 to 9 illustrate cross-sectional views taken along line A-A' of FIG. 1.
Figure 5:
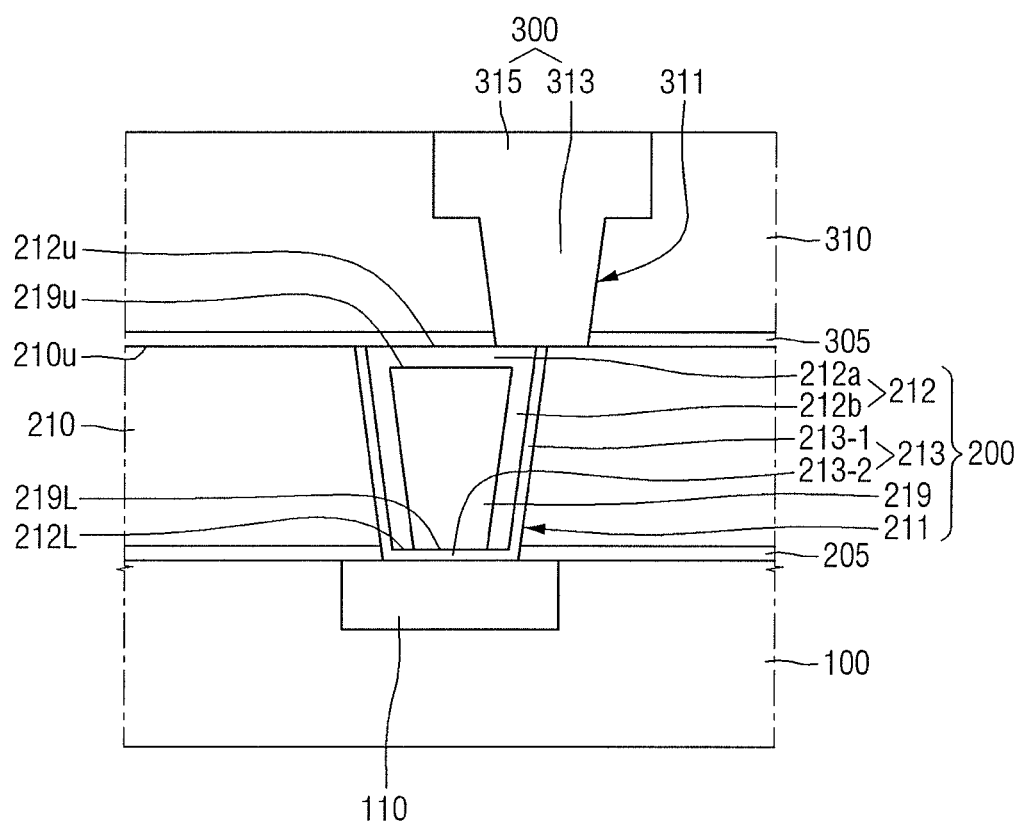

FIG. 1 is a layout diagram of a semiconductor device according to some embodiments. In FIG. 1, an interlayer insulating layer is not illustrated for clarity of the illustration. FIG. 2 is an enlarged plan view of a contact structure of FIG. 1. FIG. 3 is a perspective view of the contact structure of FIG. 1. FIGS. 4 and 5 are cross-sectional views taken along a line A-A' of FIG. 1.

Referring to FIGS. 1 to 5, a semiconductor device according to embodiments may include a lower layer 100, a wiring 300, and a contact structure 200. For example, as illustrated in FIG. 4, the contact structure 200 may connect the wiring 300 to the lower layer 100.

The lower layer 100 may be, e.g., a substrate. However, embodiments are not limited thereto, e.g., the lower layer 100 may be one of interlayer insulating layers disposed on the substrate.

For example, the lower layer 100 may be, e.g., bulk silicon or silicon-on-insulator (SOI). In another example, the lower layer 100 may contain a silicon substrate or other substances, e.g., silicon germanium, indium antimonide, lead tellurium compound, indium arsenide, indium phosphide, gallium arsenide or gallium antimonide. In yet another example, the lower layer 100 may have a configuration in which an epitaxial layer is formed on a base substrate.

Referring to FIG. 4, the lower layer 100 may include a first region 110, e.g., the first region 110 may be in an upper portion of the lower layer 100 to have an upper surface of the first region 110 level with an upper surface of a portion of the lower layer 100 other than the first region 110. The first region 110 may be a region of the lower layer 100 in contact with the contact structure 200. For example, the first region 110 may be a source or a drain of a transistor formed in the lower layer 100. In another example, the first region 110 may be a gate electrode of a transistor formed in the lower layer 100. In yet another example, the first region 110 may be a diode or the like formed in the lower layer 100, i.e., the first region 110 may be a circuit element formed in the lower layer 100 to be electrically connected to the wiring 300 to be described later via the contact structure 200. However, embodiments are not limited thereto, e.g., the first region 110 may be a constituent element for connecting a circuit element with the contact structure 200.

As further illustrated in FIG. 4, a first etching stop layer 205 may be disposed on the lower layer 100. The first etching stop layer 205, e.g., may also be formed on the first region 110 so as to cover a part of the first region 110. The first etching stop layer 205 may be a discontinuous pattern to allow a connection between the contact structure 200 and the first region 110 therethrough. For example, the first etching stop layer 205 may not be formed in a portion in which the contact structure 200 is connected to the first region 110. When forming a contact trench 211, the first etching stop layer 205 may prevent excessive etching to prevent a loss of the lower layer 100, as will be described in more detail below.

An interlayer insulating layer 210 may be disposed on the first etching stop layer 205. The interlayer insulating layer 210 may include, e.g., at least one of a low dielectric constant material, an oxide layer, a nitride layer, and an oxynitride layer to reduce the coupling phenomenon between the wirings. The low dielectric constant substance may be, e.g., FOX (Flowable Oxide), TOSZ (Tonen Sila-Zen), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof, but it is not limited thereto. For example, the interlayer insulating layer 210 may include a material having etching selectivity with respect to the first etching stop layer 205.

The interlayer insulating layer 210 may include the contact structure 200 therein. That is, as illustrated in FIG. 4, the contact structure 200 may extend through the interlayer insulating layer 210 and through the first etching stop layer 205 to, e.g., directly, contact the first region 110 of the lower layer 100. The contact structure 200 may include the contact trench 211, a barrier layer 213, a contact 219, and a capping pattern 212. However, embodiments are not limited thereto, e.g., the contact structure 200 may further include other layers as needed.

In detail, the interlayer insulating layer 210 may include the contact trench 211. The contact trench 211 is disposed in the interlayer insulating layer 210 and may pass through the interlayer insulating layer 210. The contact trench 211 may expose at least a part of the first region 110. In the drawings, the sidewalls of the contact trench 211 are illustrated as having an arbitrary inclination with respect to the upper surface of the lower layer 100, but embodiments are not limited thereto, e.g., the sidewalls of the contact trench 211 may be perpendicular to the upper surface of the lower layer 100 in accordance with the manufacturing process.

The barrier layer 213 may be on the sidewalls of the contact trench 211, e.g., the barrier layer 213 may be conformal on the sidewalls and bottom of the contact trench 211 so as not completely fill the contact trench 211. In detail, the barrier layer 213 may include a first part 213-1 and a second part 213-2. The first part 213-1 of the barrier layer 213 may be a part disposed along sidewalls of the contact trench 211, e.g., the first part 213-1 of the barrier layer 213 may be formed along the sidewalls of the contact trench 211 in a conformal manner. The second part 213-2 of the barrier layer 213 may be a part disposed along the bottom surface of the contact trench 211, e.g., the second part 213-2 of the barrier layer 213 may be formed along the bottom surface of the contact trench 211 in a conformal manner. At least a part of the second part 213-2 of the barrier layer 213 may be disposed, e.g., on the exposed part of the first region 110. In some embodiments, at least a part of the second part 213-2 of the barrier layer 213 may come into direct contact with the first region 110.

The barrier layer 213 may not be disposed on the capping layer 212a to be described later. That is, the barrier layer 213 may not be disposed on the upper surface 212U of the capping pattern 212.

The barrier layer 213 may include, e.g., titanium nitride (TiN). However, embodiments are not limited thereto. For example, the barrier layer 213 may include any suitable material as long as the material in the contact 219 is prevented from moving, e.g., diffusing, to the interlayer insulating layer 210.

The contact 219 may be disposed in the contact trench 211 so as to be spaced apart from the first part 213-1 of the barrier layer 213. The contact 219 may fill only a part of the contact trench 211. For example, the upper surface 219U of the contact 219 may be lower than the upper surface 210U of the interlayer insulating layer 210 relative to the upper surface of the lower layer 100. The second part 213-2 of the barrier layer 213 may be located, e.g., directly, between a lower surface 219L of the contact 219 and the first region 110.

In the drawings, the configuration in which the contact 219 has a shape according to a profile of the contact trench 211 is illustrated, but embodiments are not limited thereto. For example, as long as the contact 219 fills a part of the contact trench 211 and is placed in the contact trench 211 to be spaced apart from the first part 213-1 of the barrier layer 213, the contact 219 may have different shapes from the illustrated shape.

The contact 219 may include, e.g., cobalt. For example, cobalt may be deposited, e.g., by chemical vapor deposition (CVD) or electroplating, to form the contact 219 in order to allows use of a thinner barrier layer (TiN) and does not require a high-resistance nucleation layer, which may effectively reduce contact resistance. The contact 219 may electrically connect the lower layer 100 and an upper layer 310 to be described later. In detail, the contact 219 may electrically connect the first region 110 of the lower layer 100 and the wiring 300 of the upper layer 310.

A capping pattern 212 wraps around the contact 219, e.g., portions of the capping pattern 212 may be between the contact 219 and the first part 213-1 of the barrier layer 213, and may cover the upper surface 219U of the contact 219. The capping pattern 212 may not be disposed on the lower surface 219L of the contact 219. The capping pattern 212 may include a capping layer 212a and a liner 212b.

The liner 212b may be a portion that wraps around the contact 219, e.g., the portion of the capping pattern 212 that is between the contact 219 and the first part 213-1 of the barrier layer 213. The liner 212b may be disposed in a space in which the contact 219 and the first part 213-1 of the barrier layer 213 are spaced apart from each other. That is, the liner 212b may be interposed in the contact trench 211 between the first part 213-1 of the barrier layer 213 and the contact 219, e.g., to fill the space between the contact 219 and the first part 213-1. For example, the liner 212b may not be interposed between the contact 219 and the second part 213-2 of the barrier layer 213.

The capping layer 212a may be a portion disposed, e.g., directly, on the contact 219 and the liner 212b. The capping layer 212a may be disposed to fill the remaining part of the contact trench 211 which is left after the contact 219 fills a part of the contact trench 211, e.g., the capping layer 212a may fill the contact trench 211 above the contact 219.

In some embodiments, the upper surface 212U of the capping pattern 212, which is the upper surface of the contact structure 200, may be placed substantially on the same plane as the upper surface 210U of the interlayer insulating layer 210. The contact structure 200 may be disposed to penetrate the interlayer insulating layer 210. That is, as illustrated in FIG. 2, the interlayer insulating layer 210 may be disposed so as to wrap around the, e.g., entire perimeter of the, barrier layer 213 and expose the upper surface 212U of the capping pattern 212. The barrier layer 213 may wrap around the, e.g., entire perimeter of the, capping pattern 212, and may cover the lower surface 212L of the capping pattern 212 and the lower surface 219L of the contact 219 (FIGS. 2-4).

The capping pattern 212 may include a substance. e.g., material, having an etching selectivity with respect to oxide. Here, the etching selectivity may mean that the capping pattern 212 is not substantially etched, while performing the etching process of the oxide-containing constituent element, using the etching solution capable of etching the oxide. That is, the etching selectivity may mean that the capping pattern 212 does not react with the etching solution capable of etching the oxide. Further, conversely, the etching selectivity may mean that the oxide-containing constituent element is not substantially etched, while performing the etching process of the capping pattern 212, using the etching solution capable of etching the capping pattern 212. At this time, the oxide-containing constituent element may be, e.g., the upper layer 310. The capping pattern 212 may include, e.g., any one of ruthenium and tungsten deposited by CVD or an electroless deposition.

In the semiconductor device according to embodiments, the capping pattern 212 wrapping around the contact 219 and covering the upper surface of the contact 219 is disposed in the interlayer insulating layer 210, and the capping pattern 212 includes a material having an etching selectivity with respect to an oxide. Accordingly, it is possible to greatly reduce the loss of the contact 219 that may occur in a subsequent process.

In detail, when the capping pattern 212 includes a material having an etching selectivity with respect to an oxide, the capping pattern 212 may not be substantially etched in an etching process using hydrofluoric (HF) acid or the like in a subsequent process. That is, since the capping pattern 212 is disposed so as to, e.g., completely, cover the periphery and the upper surface of the contact 219, the possibility of damage to the contact 219 may be greatly reduced. In other words, when the capping pattern 212 is wrapped around the periphery, e.g., entire sidewalls, as well as on the upper surface of the contact 219, the contact 219 may be completely covered and protected by the capping pattern 212. Therefore, loss of the contact 219, e.g., loss of material of the contact 219 during a subsequent etching, may be substantially reduced, e.g., as compared to a capping pattern covering only the upper surface of the contact without covering sidewalls thereof. Here, the subsequent process may include, e.g., a process of etching the upper layer 310 for forming the wiring, a cleaning process, and the like. For example, in the process of etching the upper layer 310 containing an oxide to form the wiring 300 to be described later, since the capping pattern 212 contains a substance having etching selectivity with respect to the oxide, the capping pattern 212 may not be substantially etched.

A second etching stop layer 305 may be disposed on the interlayer insulating layer 210. The second etching stop layer 305 may also be formed on the contact structure 200 so as to cover a part of the capping pattern 212. The second etching stop layer 305 may be a discontinuous pattern to allow a connection between the wiring 300 and the contact structure 200 therethrough. For example, the second etching stop layer 305 may not be formed in a portion in which the contact structure 200 is connected to the wiring 300. When forming a via hole 311 in the upper layer 310, the second etching stop layer 305 may prevent excessive etching to prevent loss of the contact structure 200 or the like.

In the drawings, the first etching stop layer 205 and the second etching stop layer 305 are illustrated as a single layer structure, but embodiments are not limited thereto. For example, each of the first etching stop layer 205 and the second etching stop layer 305 may have a multi-layer structure.

The upper layer 310 may be disposed on the second etching stop layer 305. Further, the upper layer 310 may be disposed on the upper surface 212U of the capping pattern 212 of the contact structure 200. Therefore, the contact structure 200 and the interlayer insulating layer 210 may be disposed between the lower layer 100 and the upper layer 310. The upper layer 310 may include, e.g. an oxide.

In the semiconductor device according to embodiments, in the etching process for etching the upper layer 310 containing an oxide to form the via hole 311, since the capping pattern 212 includes a material having an etching selectivity with respect to the oxide, the capping pattern 212 may not be substantially etched. In this case, since the capping pattern 212 is disposed so as to cover the periphery and the upper surface of the contact 219, the contact 219 may be protected during the etching process of the upper layer 310 for forming the via hole 311. This substantially reduces the possibility of loss of the contact 219 that may occur in a subsequent process, e.g., during etching of the upper layer 310, after forming the contact 219.

The upper layer 310 may include the via hole 311 and the wiring 300 disposed inside the via hole 311.

The via hole 311 may be disposed inside the upper layer 310. The via hole 311 may penetrate the upper layer 310 to expose at least a part of the upper surface 212U of the capping pattern 212. For example, as illustrated in FIG. 4, the via hole 311 may be formed so as to expose only the upper surface 212U of the capping pattern 212, e.g., the via hole 311 may be centered with respect to the contact 219. In another example, as illustrated in FIG. 5, the via hole 311 may be formed so as to expose a part of the upper surface 212U of the capping pattern 212 and a part of the upper surface 210U of the interlayer insulating layer 210, e.g., the via hole 311 may be offset with respect to the contact 219 to have the center of the via hole 311 horizontally spaced apart from the center of the contact 219.

For example, the via hole 311 may be filled with a metal material to form the wiring 300. The wiring 300 may be disposed so as to penetrate the upper layer 310. The wiring 300 may be electrically connected to the first region 110 of the lower layer 100 via the contact structure 200. The via hole 311 may include an upper part and a lower part.

A via contact 313 may be disposed in the lower part of the via hole 311. That is, when the via hole 311 is filled with, e.g., a metal material, the via contact 313 may be formed in the lower part of the via hole 311. For example, as illustrated in FIG. 4, the lower surface of the via contact 313 may come into direct contact with at least a part of the upper surface 212U of the capping pattern 212. In another example, as illustrated in FIG. 5, only part of the lower surface of the via contact 313 may come into direct contact with a part of the upper surface 212U of the capping pattern 212, as the lower surface of the via contact 313 may also contact the interlayer insulating layer 210.

A wiring pattern 315 may be disposed in the upper part of the via hole 311. That is, when the via hole 311 is filled with, e.g., a metal material, the wiring pattern 315 may be formed on the upper part of the via hole 311. The wiring pattern 315 may be electrically connected to the contact structure 200 through the via contact 313. For example, as illustrated in FIG. 4, the via contact 313 and the wiring pattern 315 may be integral with each other, i.e., define a single and seamless element.

Figure 6:
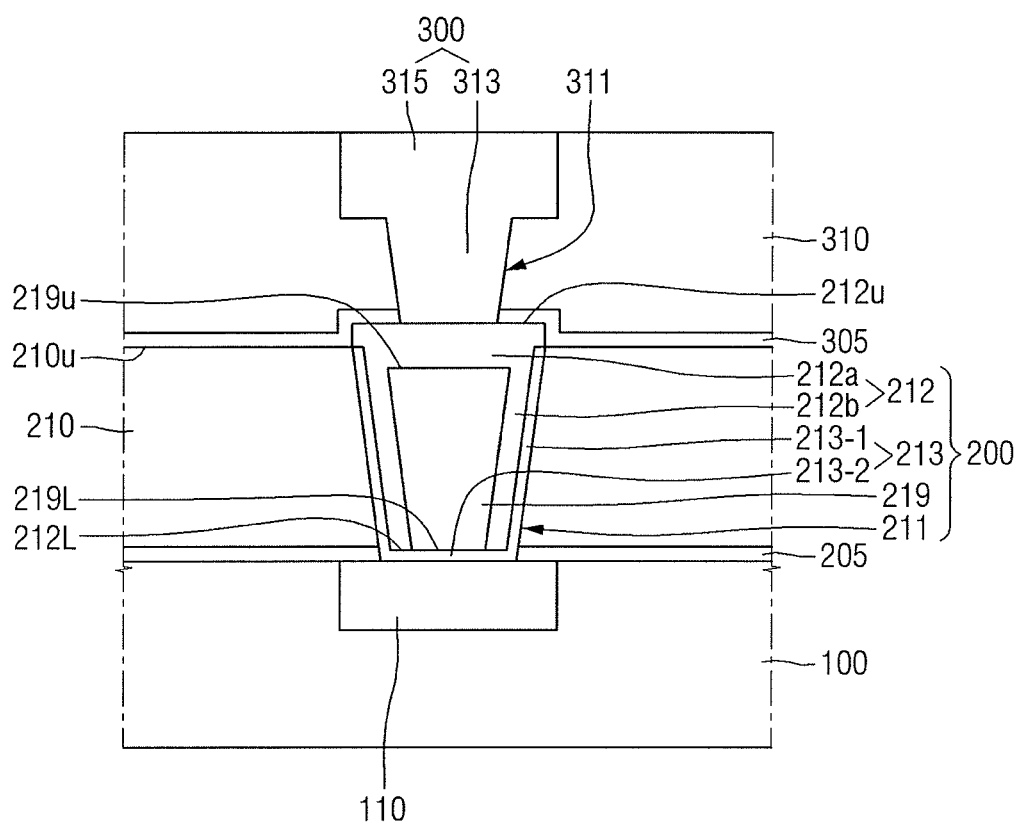
Figure 7:
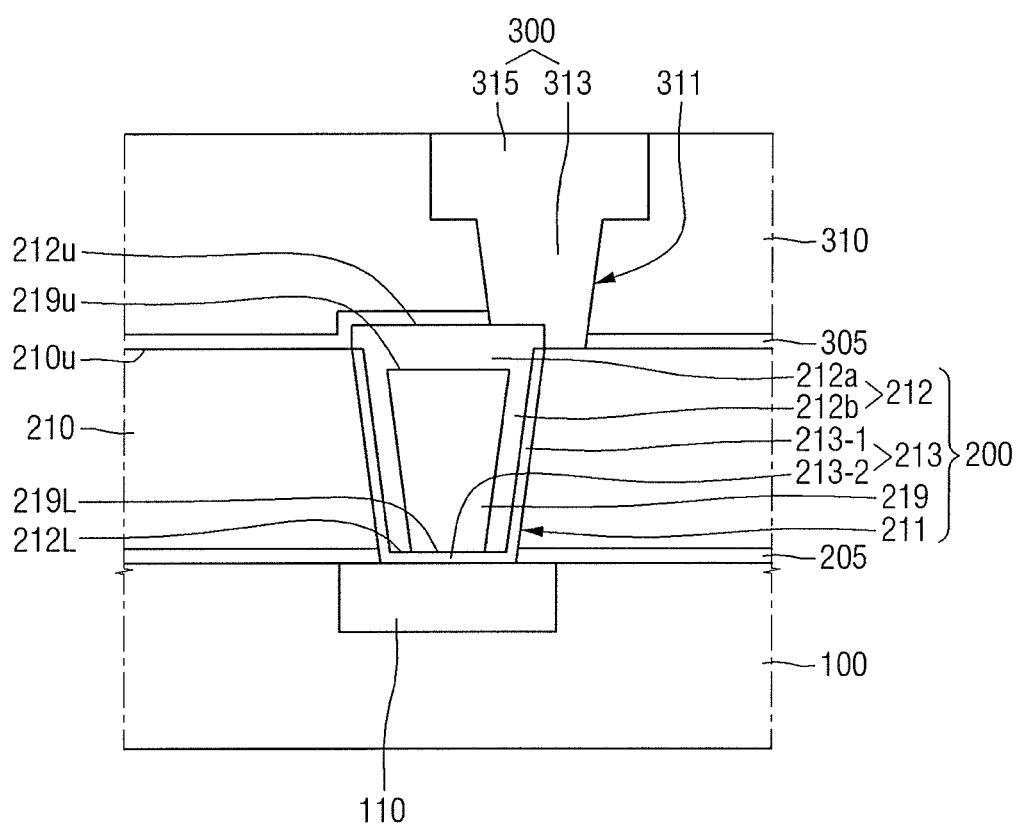

Hereinafter, a semiconductor device according to some embodiments will be described with reference to FIGS. 1 to 3, 6 and 7. For clarity of explanation, repeated parts of those described above will not be described. FIGS. 6 and 7 are cross-sectional views taken along line A-A' of FIG. 1.

Referring to FIGS. 1 to 3, 6 and 7, the upper surface 212U of the capping pattern 212 may protrude above the upper surface 210U of the interlayer insulating layer 210. In the drawings, the corners of the portion protruding from the upper surface 210U of the interlayer insulating layer 210 are illustrated as right angles in the capping layer 212a of the capping pattern 212, but this is only an example, and embodiments are not limited thereto. For example, the portions of the capping layer 212a protruding above the upper surface 210U of the interlayer insulating layer 210 may have a chamfered shape.

The second etching stop layer 305 may be formed along the profiles of the upper surface 210U of the interlayer insulating layer 210 and the upper surface 212U of the capping layer 212a. Even when the upper surface 212U of the capping pattern 212 protrudes above the upper surface 210U of the interlayer insulating layer 210, the lower surface of the via contact 313 may come into direct contact with at least a part of the upper surface 212U of the capping pattern 212. For example, as illustrated in FIG. 6, the lower surface of the via contact 313 may come into direct contact with a part of the upper surface 212U of the capping pattern 212. In another example, as illustrated in FIG. 7, the lower surface of the via contact 313 may come into direct contact with a part of the upper surface 212U of the capping pattern 212 and with a part of the upper surface 210U of the interlayer insulating layer 210.

In the semiconductor device according to embodiments, the capping layer 212a is also disposed so as to protrude upward from the upper surface 210U of the interlayer insulating layer 210, while filling the remaining part of the contact trench 211. Accordingly, even if a slight misalignment occurs, as illustrated in FIG. 7, the capping layer 212a may cover the upper surface of the contact 219. This reduces the possibility of loss of the contact 219 that may occur in a subsequent process. Therefore, the yield of the semiconductor device may be improved.

Figure 8:
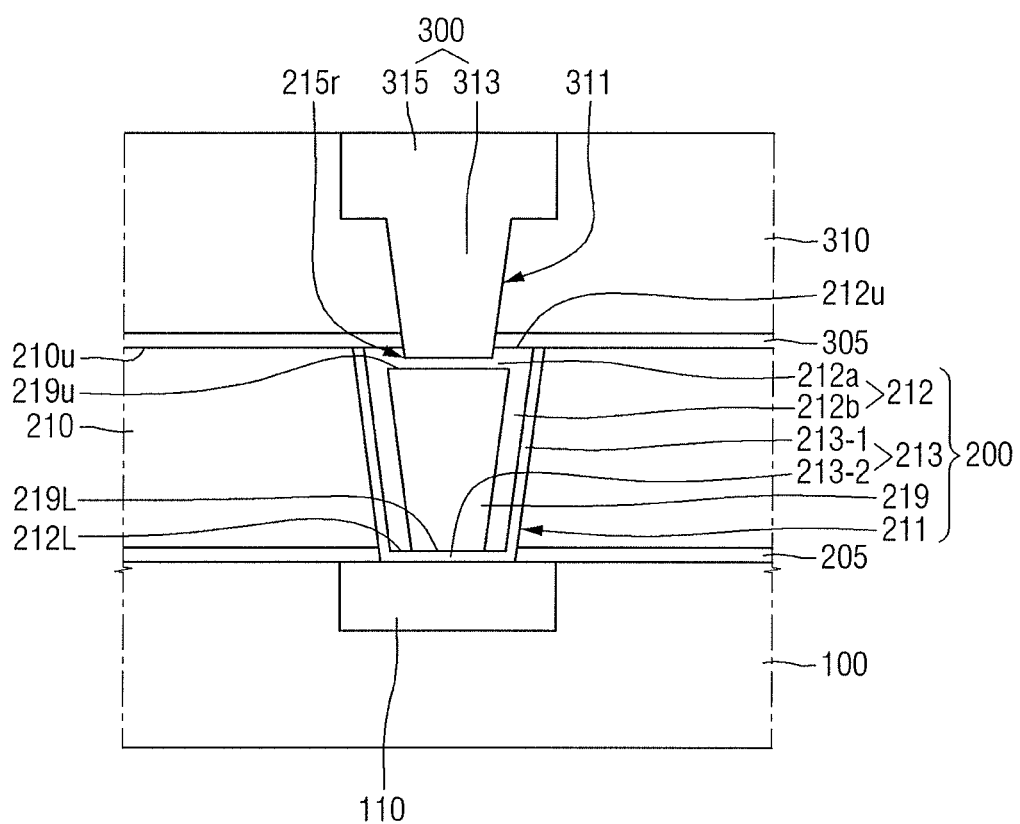
Figure 9:
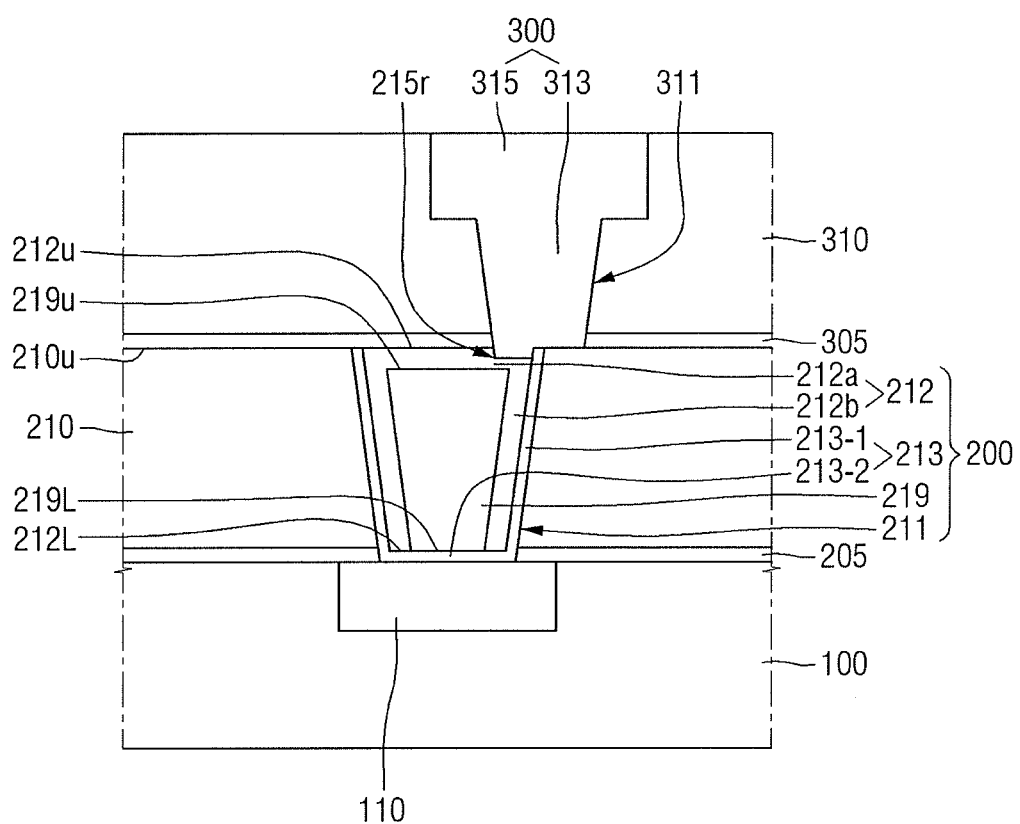

Hereinafter, semiconductor devices according to some embodiments will be described with reference to FIGS. 1 to 3, 8 and 9. For clarity of explanation, repeated parts of those described above will not be described. FIGS. 8 and 9 are cross-sectional views taken along line A-A' of FIG. 1.

Referring to FIGS. 1 to 3, 8 and 9, the upper surface 212U of the capping pattern 212 may include a recess 215r. That is, the capping layer 212a may include a recess 215r.

On the basis of the upper surface of the lower layer 100, the bottom surface of the recess 215r may be located to be higher than the upper surface 219U of the contact 219. On the basis of the upper surface of the lower layer 100, the bottom surface of the recess 215r may be located to be lower than the upper surface 210U of the interlayer insulating layer 210.

The recess 215r may be filled with the via contact 313. That is, a part of the via contact 313 may be inserted into the capping pattern 212. Both sidewalls and the bottom surface of the recess 215r may be defined by the capping layer 212a. In this case, the lower surface of the via hole 311 may be defined by the bottom surface of the recess 215r.

In another example, as illustrated in FIG. 9, only a part of the lower surface of the via hole 311 may be defined by the bottom surface of the recess 215r. That is, one sidewall of the recess 215r may be defined by the first part 213-1 of the barrier layer 213, and the other sidewall of the recess 215r may be defined by the capping layer 212a. In this case, a part of the lower part of the via contact 313 may be inserted into the recess 215r, and the remaining part of the lower part of the via contact 313 may be inserted into the first part 213-1 of the barrier layer 213.

By way of summation and review, in order to reduce contact resistance in a semiconductor device, it may be required to change a contact gap fill substance. For example, when cobalt is used as the gap fill material of the contact, the thickness of the barrier layer may be reduced. However, the contact structure may be damaged during a subsequent process, thereby lowering the productivity of the semiconductor device.

In contrast, an aspect of the present disclosure provides a method of manufacturing a semiconductor device capable of preventing damage to the contact structure, thereby improving yield of the semiconductor device. That is, exposed sidewalls and an upper surface of the contact may be completely covered by a capping pattern, which is formed of a material having an etching selectivity with respect to an oxide, thereby greatly reducing loss of the contact that may occur in a subsequent process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a lower layer;
an upper layer on the lower layer, the upper layer including a wiring through an oxide layer;
a contact between the lower layer and the upper layer, the contact electrically connects the lower layer and the wiring of the upper layer;
a capping pattern wrapping around the contact and covering an upper surface of the contact, the capping pattern being in direct contact with the wiring;
a barrier layer wrapping around the capping pattern and covering a lower surface of the capping pattern and a lower surface of the contact; and an interlayer insulating layer between the lower layer and the upper layer, the interlayer insulating layer wrapping around the barrier layer and exposing an upper surface of the capping pattern, wherein the capping pattern includes a material having an etching selectivity with respect to the oxide layer in the upper layer, wherein the barrier layer does not extend along an upper surface of the capping pattern, and wherein the capping pattern does not extend along the lower surface of the contact.

2. The semiconductor device as claimed in claim 1, wherein the capping pattern includes one of ruthenium and tungsten.

3. The semiconductor device as claimed in claim 1, wherein the contact includes cobalt.

4. The semiconductor device as claimed in claim 1, wherein the upper surface of the capping pattern protrudes above an upper surface of the interlayer insulating layer.

5. The semiconductor device as claimed in claim 1, wherein:

the oxide layer of the upper layer is on the interlayer insulating layer and on the upper surface of the capping pattern, and the oxide layer includes a via hole exposing at least a part of the upper surface of the capping pattern, the wiring directly contacting the exposed part of the upper surface of the capping pattern and filling the via hole.

6. The semiconductor device as claimed in claim 5, wherein the upper surface of the capping pattern includes a recess, and a part of the wiring is in the recess.

7. The semiconductor device as claimed in claim 5, wherein the barrier layer is not on the upper surface of the capping pattern, at least a part of the upper surface of the capping pattern directly contacting the wiring, and at least a part of a lower surface of the barrier layer directly contacting the lower layer.

8. The semiconductor device as claimed in claim 1, wherein the barrier layer is only on sidewalls and a lower surface of the capping pattern among surfaces of the capping pattern.

9. The semiconductor device as claimed in claim 1, wherein the capping pattern is only on sidewalls and the upper surface of the contact among surfaces of the contact.

10. A semiconductor device, comprising:
a lower layer including a first region;
an interlayer insulating layer on the lower layer;
a contact trench through the interlayer insulating layer to expose at least a part of the first region in the lower layer;
a barrier layer having a first part along sidewalls of the contact trench, and a second part along a bottom surface of the contact trench;
a contact in the contact trench, the contact being spaced apart from the first part of the barrier layer, and a bottom of the contact being in direct contact with the second part of the barrier layer; and
a capping pattern on the contact, the capping pattern including:
a liner inside the contact trench between the contact and the first part of the barrier layer, and
a capping layer on the contact and on the liner, the capping layer filling a remaining part of the contact trench, wherein the capping layer and the liner include one of ruthenium and tungsten, wherein the barrier layer does not extend along an upper surface of the capping pattern, and wherein the capping pattern does not extend along the lower surface of the contact.

11. The semiconductor device as claimed in claim 10, wherein an upper surface of the capping layer protrudes above an upper surface of the interlayer insulating layer.

12. The semiconductor device as claimed in claim 10, further comprising:
an upper layer on the interlayer insulating layer and on an upper surface of the capping layer, the upper layer including a via hole to expose at least a part of the upper surface of the capping layer, and
a wiring filling the via hole, the wiring being in direct contact with the upper surface of the capping layer.

13. The semiconductor device as claimed in claim 12, wherein the upper surface of the capping layer includes a recess, and a part of the wiring is in the recess.

14. The semiconductor device as claimed in claim 10, wherein the contact includes cobalt.

15. The semiconductor device as claimed in claim 10, wherein the liner is directly between the contact and the first part of the barrier layer.

16. A semiconductor device, comprising:
a lower layer;
an interlayer insulating layer on the lower layer;
an oxide layer on the interlayer insulating layer, a wiring extending through the oxide layer;
a contact through the interlayer insulating layer and electrically connected to the lower layer and to the wiring;
a capping pattern directly on sidewalls and on an upper surface of the contact, the capping pattern being between the interlayer insulating layer and sidewalls of the contact; and
a barrier layer on the sidewalls and on a bottom of the contact, portions of the capping pattern being between the barrier layer and the interlayer insulating layer, wherein the capping pattern is in direct contact with the wiring, the capping pattern including a material having an etching selectivity with respect to the oxide layer, wherein the barrier layer does not extend along an upper surface of the capping pattern, and wherein the capping pattern does not extend along the lower surface of the contact.

17. The semiconductor device as claimed in claim 16, wherein the capping pattern covers the sidewalls and upper surface of the contact in their entirety.

18. The semiconductor device as claimed in claim 17, wherein the capping pattern is only on the sidewalls and upper surface of the contact among surfaces of the contact.

19. The semiconductor device as claimed in claim 18, wherein upper surfaces of the barrier layer, the capping pattern, and the interlayer insulating layer are level.

* * * * *